(12) United States Patent
Kuo et al.

(10) Patent No.: US 8,796,688 B2
(45) Date of Patent: Aug. 5, 2014

(54) PIXEL STRUCTURE, METHOD OF MANUFACTURING PIXEL STRUCTURE, AND ACTIVE DEVICE MATRIX SUBSTRATE

(75) Inventors: Feng-Weei Kuo, Pingtung County (TW); Ko-Ruey Jen, Taipei (TW); Chia-Hua Yu, New Taipei (TW); I-Fang Wang, Changhua County (TW)

(73) Assignee: Hannstar Display Corporation, New Taipei (TW)

( * ) Notice: Subject to any disclaimer, the term of this patent is extended or adjusted under 35 U.S.C. 154(b) by 218 days.

(21) Appl. No.: 13/592,347

(22) Filed: Aug. 23, 2012

(65) Prior Publication Data

US 2013/0328052 A1   Dec. 12, 2013

(30) Foreign Application Priority Data

Jun. 8, 2012  (CN) .......................... 2012 1 0190372

(51) Int. Cl.
*H01L 29/04* (2006.01)

(52) U.S. Cl.
USPC ................................. 257/59; 257/72; 257/258

(58) Field of Classification Search
USPC ............................................... 257/59, 72, 258
See application file for complete search history.

(56) References Cited

U.S. PATENT DOCUMENTS

2002/0180901 A1* 12/2002 Kim ................................ 349/43
2007/0019124 A1*  1/2007 Kim ................................ 349/43

* cited by examiner

*Primary Examiner* — Tan N Tran
(74) *Attorney, Agent, or Firm* — Jianq Chyun IP Office

(57) ABSTRACT

A pixel structure, a method of manufacturing the pixel structure, and an active device matrix substrate are provided. The pixel structure includes a first patterned metal layer having a common line and a gate; a first insulation layer; a semiconductor pattern; a second patterned metal layer having a source and a drain both electrically connected to the semiconductor pattern; a second insulation layer having a contact opening exposing the drain; and an electrode layer having a common electrode, and a pixel electrode connected to the drain through the contact opening. The common line, the first insulation layer, and the pixel electrode constitute a first storage capacitor. The common line, the drain, and the common electrode constitute a sandwich structure. The common line, the first insulation layer, and the drain constitute a second storage capacitor. The drain, the second insulation layer, and the common electrode constitute a third storage capacitor.

20 Claims, 11 Drawing Sheets

PIXEL STRUCTURE, METHOD OF MANUFACTURING PIXEL STRUCTURE, AND ACTIVE DEVICE MATRIX SUBSTRATE

CROSS-REFERENCE TO RELATED APPLICATION

This application claims the priority benefit of China application serial no. 201210190372.6, filed on Jun. 8, 2012. The entirety of the above-mentioned patent application is hereby incorporated by reference herein and made a part of this specification.

BACKGROUND OF THE INVENTION

1. Field of Invention

The invention relates to a pixel structure, a method of manufacturing a pixel structure, and an active device matrix substrate. More particularly, the invention relates to a pixel structure that has favorable storage capacitors and is capable of displaying images with high quality, a method of manufacturing the pixel structure, and an active device matrix substrate with the pixel structure.

2. Description of Related Art

Among the displays, liquid crystal display (LCD) has become the mainstream display. With the development of the LCD panels and the increasing requirements of the LCD panels for fast response speed, wide viewing angle, color shift prevention, etc., the LCDs may be in various display modes, e.g., multi-vertical alignment liquid crystal displays (MVA-LCD) capable of performing wide-viewing-angle display functions, in-plane switch liquid crystal displays (IPS-LCD), and so forth.

In the conventional IPS-LCD, a substantially lateral electric field generated by the coplanar pixel electrode and common electrode reorients (tilts) liquid crystal molecules, which determines whether light is allowed to pass through the LCD or not. Since the storage capacitor in a pixel structure of the conventional IPS-LCD is overlay small, flickers are likely to occur in the display image of the IPS-LCD. When the flickering issue becomes worse, image retention and cross talk may easily happen.

If, to better resolve the flickering issue, by increasing the amount of the storage capacitor in the pixel structure, the common electrode occupies the area of the pixel structure, which may however reduce the aperture ratio of the pixel structure and further deteriorate light utilization efficiency. Hence, the large storage capacitor and the high aperture ratio have been a trade-off issue for a long time, and thus it is necessary to develop a pixel structure that may have the large storage capacitor and the high aperture ratio.

SUMMARY OF THE INVENTION

The invention is directed to a pixel structure that simultaneously having a favorable aperture ratio and a sufficiently large storage capacitor, and thereby images with satisfactory quality may be displayed.

The invention is further directed to a method of manufacturing a pixel structure. By applying the method, the aforesaid pixel structure may be formed.

The invention is further directed to an active device matrix substrate having the aforesaid pixel structure.

In an embodiment of the invention, a pixel structure disposed on a substrate and driven by a scan line and a data line is provided. The pixel structure includes a first patterned metal layer disposed on a substrate and having a common line and a gate, a first insulation layer covering the first patterned metal layer, a semiconductor pattern located on the first insulation layer above the gate, a second patterned metal layer disposed on the first insulation layer and having a source and a drain both electrically connected to the semiconductor pattern, a second insulation layer covering the second patterned metal layer and having a contact opening exposing the drain, and an electrode layer disposed on the second insulation layer and having a pixel electrode and a common electrode. The pixel electrode is connected to the drain through the contact opening. The common line, the first insulation layer, and the pixel electrode together constitute a first storage capacitor. The common line, the drain, and the common electrode together constitute a sandwich-like structure. The common line, the first insulation layer, and the drain together constitute a second storage capacitor. The drain, the second insulation layer, and the common electrode together constitute a third storage capacitor. A portion of the drain is extended above the common line and overlapped with the first insulation layer above the common line.

According to an embodiment of the invention, a portion of the common electrode is extended above the common line and overlapped with the second insulation layer above the common line.

According to an embodiment of the invention, the pixel electrode and the common electrode are alternately arranged.

According to an embodiment of the invention, a portion of the scan line is the gate.

According to an embodiment of the invention, a portion of the data line is the source.

According to an embodiment of the invention, the gate, the source, and the drain together constitute an active switch device.

According to an embodiment of the invention, a material of the electrode layer is selected from indium tin oxide (ITO), indium zinc oxide (IZO), and a combination thereof.

In an embodiment of the invention, a method of manufacturing a pixel structure on a substrate is provided. The pixel structure is driven by a scan line and a data line, and the method includes but is not limited to following steps. A first patterned metal layer is formed on the substrate, and the first patterned metal layer has a common line and a gate. A first insulation layer is formed, and the first insulation layer covers the first patterned metal layer. A semiconductor pattern is formed on the first insulation layer above the gate. A second patterned metal layer is formed on the first insulation layer, and the second patterned metal layer has a source and a drain. The source and the drain are electrically connected to the semiconductor pattern. A second insulation layer is formed to cover the second patterned metal layer, and the second insulation layer has a contact opening that exposes the drain. An electrode layer is formed on the second insulation layer, and the electrode layer has a pixel electrode and a common electrode. The pixel electrode is connected to the drain through the contact opening. Here, the common line, the first insulation layer, and the pixel electrode together constitute a first storage capacitor; the common line, the drain, and the common electrode together constitute a sandwich structure; the common line, the first insulation layer, and the drain together constitute a second storage capacitor; the drain, the second insulation layer, and the common electrode together constitute a third storage capacitor. A portion of the drain is extended above the common line and overlapped with the first insulation layer above the common line.

According to an embodiment of the invention, a portion of the common electrode is extended above the common line and overlapped with the second insulation layer above the common line.

According to an embodiment of the invention, the pixel electrode and the common electrode are alternately arranged.

According to an embodiment of the invention, a portion of the scan line is the gate.

According to an embodiment of the invention, a portion of the data line is the source.

According to an embodiment of the invention, the gate, the source, and the drain together constitute an active switch device.

According to an embodiment of the invention, a material of the electrode layer is selected from ITO, IZO, and a combination thereof.

In an embodiment of the invention, an active device matrix substrate including a substrate and a plurality of pixel structures disposed on the substrate is provided. Each of the pixel structures includes a first patterned metal layer disposed on a substrate and having a common line and a gate, a first insulation layer covering the first patterned metal layer, a semiconductor pattern located on the first insulation layer above the gate, a second patterned metal layer disposed on the first insulation layer and having a source and a drain both electrically connected to the semiconductor pattern, a second insulation layer covering the second patterned metal layer and having a contact opening exposing the drain, and an electrode layer disposed on the second insulation layer and having a pixel electrode and a common electrode. The pixel electrode is connected to the drain through the contact opening. Here, the common line, the first insulation layer, and the pixel electrode together constitute a first storage capacitor; the common line, the drain, and the common electrode together constitute a sandwich structure; the common line, the first insulation layer, and the drain together constitute a second storage capacitor; the drain, the second insulation layer, and the common electrode together constitute a third storage capacitor. A portion of the drain is extended above the common line and overlapped with the first insulation layer above the common line.

According to an embodiment of the invention, a portion of the common electrode is extended above the common line and overlapped with the second insulation layer above the common line.

According to an embodiment of the invention, the pixel electrode and the common electrode are alternately arranged.

In an embodiment of the invention, a pixel structure that is disposed on a substrate and driven by a scan line and a data line is provided. The pixel structure includes a first patterned metal layer disposed on a substrate and having a common line and a gate, a first insulation layer covering the first patterned metal layer, a semiconductor pattern located on the first insulation layer above the gate, a second patterned metal layer disposed on the first insulation layer and having a source and a drain both electrically connected to the semiconductor pattern, a first electrode layer disposed above the second patterned metal layer and electrically connected to the drain, a second insulation layer covering the first electrode layer, and a second electrode layer disposed on the second insulation layer. Here, the common line, the first insulation layer, and the first electrode layer together constitute a first storage capacitor; the first electrode layer, the second insulation layer, and the second electrode layer together constitute a second storage capacitor; a portion of the drain is extended above the common line and overlapped with the first insulation layer above the common line.

According to an embodiment of the invention, a portion of the second electrode layer is extended above the common line and overlapped with the second insulation layer above the common line.

According to an embodiment of the invention, a material of the first electrode layer and a material of the second electrode layer are selected from ITO, IZO, and a combination thereof.

As described above, in the pixel structure described above, the common line, the first insulation layer, and the pixel electrode pixel together constitute the first storage capacitor. Besides, within the limited area, the overlapping area of the common line, the drain, and the common electrode constitutes a sandwich structure, which may further increase the amount of the storage capacitor. Namely, the common line, the first insulation layer, and the drain together constitute the second storage capacitor, and the drain, the second insulation layer, and the common electrode together constitute the third storage capacitor. Hence, the area of the pixel structure is not additionally occupied, and the pixel structure can still have the favorable aperture ratio. Moreover, the amount of the storage capacitor is sufficient. As a result, the pixel structure described herein may simultaneously have a favorable aperture ratio and a sufficiently large storage capacitor, and thereby images with satisfactory quality may be displayed.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DETAILED DESCRIPTION OF DISCLOSED EMBODIMENTS

The accompanying drawings and embodiments are provided below to elaborate features and effects of a pixel structure, a method of manufacturing the pixel structure, and an active device matrix substrate.

Method of Manufacturing Pixel Structure

FIG. 1 to FIG. 5 are schematic top views illustrating a process of manufacturing a pixel structure according to an embodiment of the invention. FIG. 6A is a schematic cross-sectional view taken along a sectional line A-A' depicted in FIG. 5. FIG. 6B is a schematic cross-sectional view taken along a sectional line B-B' depicted in FIG. 5. FIG. 6C is a cross-sectional schematic view taken along a sectional line C-C' depicted in FIG. 5.

Each step of manufacturing the pixel structure 100 is explained with reference to FIG. 1 to FIG. 5, and the relations of the stacked film layers in the pixel structure 100 are illustrated in FIG. 6A to FIG. 6C.

Figure 1:
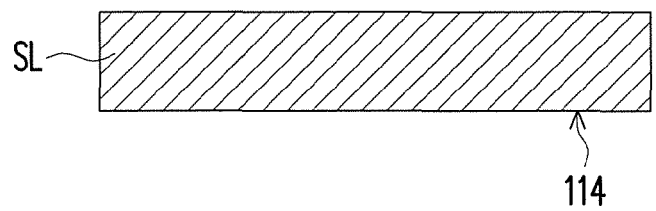
FIG. 1 to FIG. 5 are schematic top views illustrating a process of manufacturing a pixel structure according to an embodiment of the invention.
Figure 1:
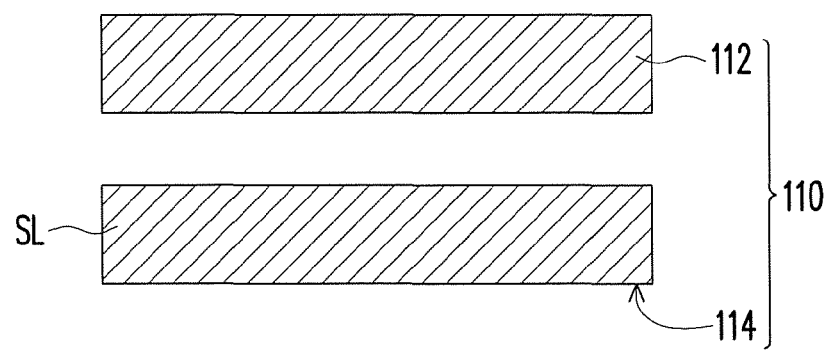

As shown in FIG. 1 and FIG. 6C, the pixel structure 100 is formed on a substrate SUB, and the pixel structure 100 is driven by a scan line SL and a data line DL. A first patterned metal layer 110 is formed on the substrate SUB (shown in FIG. 6C), and the first patterned metal layer 110 has a common line 112 and a gate 114. In an embodiment of the invention, a metal layer (not shown) may be formed on the substrate SUB by performing a sputtering process, and a great portion of the metal layer is removed by photo-etching, so as to form the first patterned metal layer 110. In the step shown in FIG. 1, the scan line SL may be formed. The scan line SL is parallel to the common line 112, and the common line 112 serves as an electrode for forming a storage capacitor in subsequent steps. Besides, in an embodiment of the invention, a portion of the scan line SL may directly act as the gate 114; in another embodiment, the gate 114 may protrude from the scan line SL (not shown).

Figure 2:
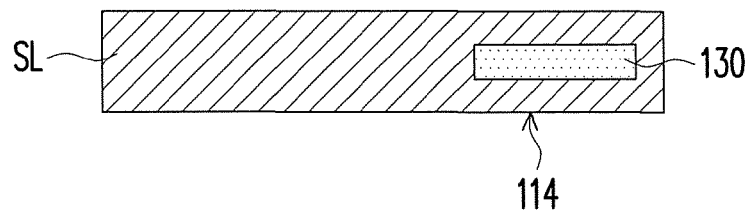
Figure 2:
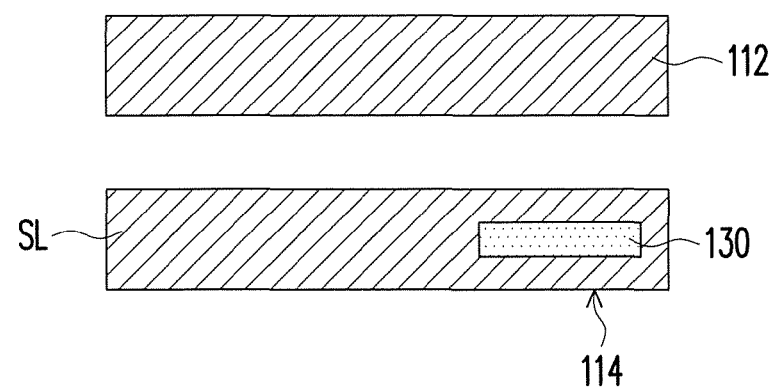

With reference to FIG. 2 and FIG. 6C, a first insulation layer 120 (shown in FIG. 6C) is formed, and the first insulation layer 120 covers the first patterned metal layer 110. In an embodiment of the invention, the first insulation layer 120 may be formed by performing a chemical vapor deposition (CVD) process to cover the substrate SUB with an insulation layer (not shown), and the insulation layer may be made of silicon oxide, silicon nitride, or any other appropriate material.

With reference to FIG. 2 and FIG. 6C, a semiconductor pattern 130 is formed on the first insulation layer 120 above the gate 114. The semiconductor pattern 130 may be formed by performing a CVD process to cover the substrate SUB with a semiconductor layer (not shown), and a great portion of the semiconductor layer is removed by photo-etching, so as to form the semiconductor pattern 130. The semiconductor pattern 130 may serve as a channel layer of a subsequently-formed active device.

Figure 3:
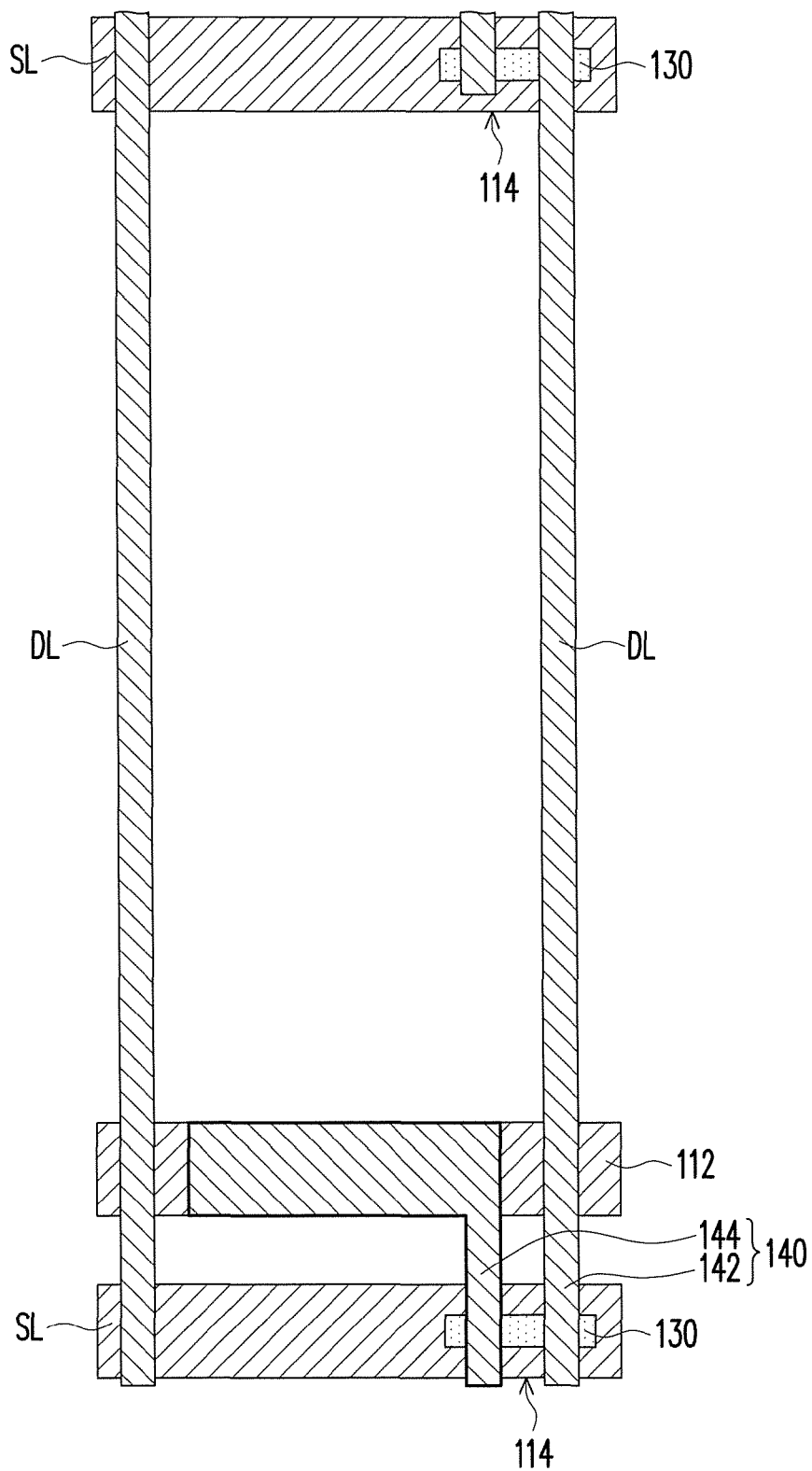

With reference to FIG. 3 and FIG. 6C, a second patterned metal layer 140 is formed on the first insulation layer 120, and the second patterned metal layer 140 has a source 142 and a drain 144. The source 142 and the drain 144 are electrically connected to the semiconductor pattern 130. In an embodiment of the invention, a metal layer (not shown) may be formed on the first insulation layer 120 by performing a sputtering process, and a great portion of the metal layer is removed by photo-etching, so as to form the second patterned metal layer 140. Moreover, a data line DL may also be formed in the step shown in FIG. 3. According to an embodiment of the invention, a portion of the data line DL serves as the source 142. Here, the gate 114, the source 142, and the drain 144 together constitute an active switch device, and the active switch device is electrically connected to the scan line SL and the data line DL, so as to turn on or turn off the pixel structure. Besides, as described in the embodiment shown in FIG. 3 and FIG. 6C, the source 142 and the drain 144 are configured at two respective sides of the semiconductor pattern 130. However, in other embodiments of the invention, the position relations among the source 142, the drain 144, and the semiconductor pattern 130 may be determined in consideration of the type of the active switch device, e.g., a U-shaped thin film transistor (TFT), a TFT shaped as a roman numeral III, an L-shaped TFT, and so on. The type of the active switch device herein is merely exemplary and should not be construed as a limitation to the invention.

It should be mentioned that a portion of the drain 144 is extended above the common line 112 and overlapped with the first insulation layer 120 above the common line 112, as shown in FIG. 3. According to the above-mentioned design, said components may be stacked to form a relatively large storage capacitor within the limited area, and the aperture ratio is not reduced.

Figure 4:
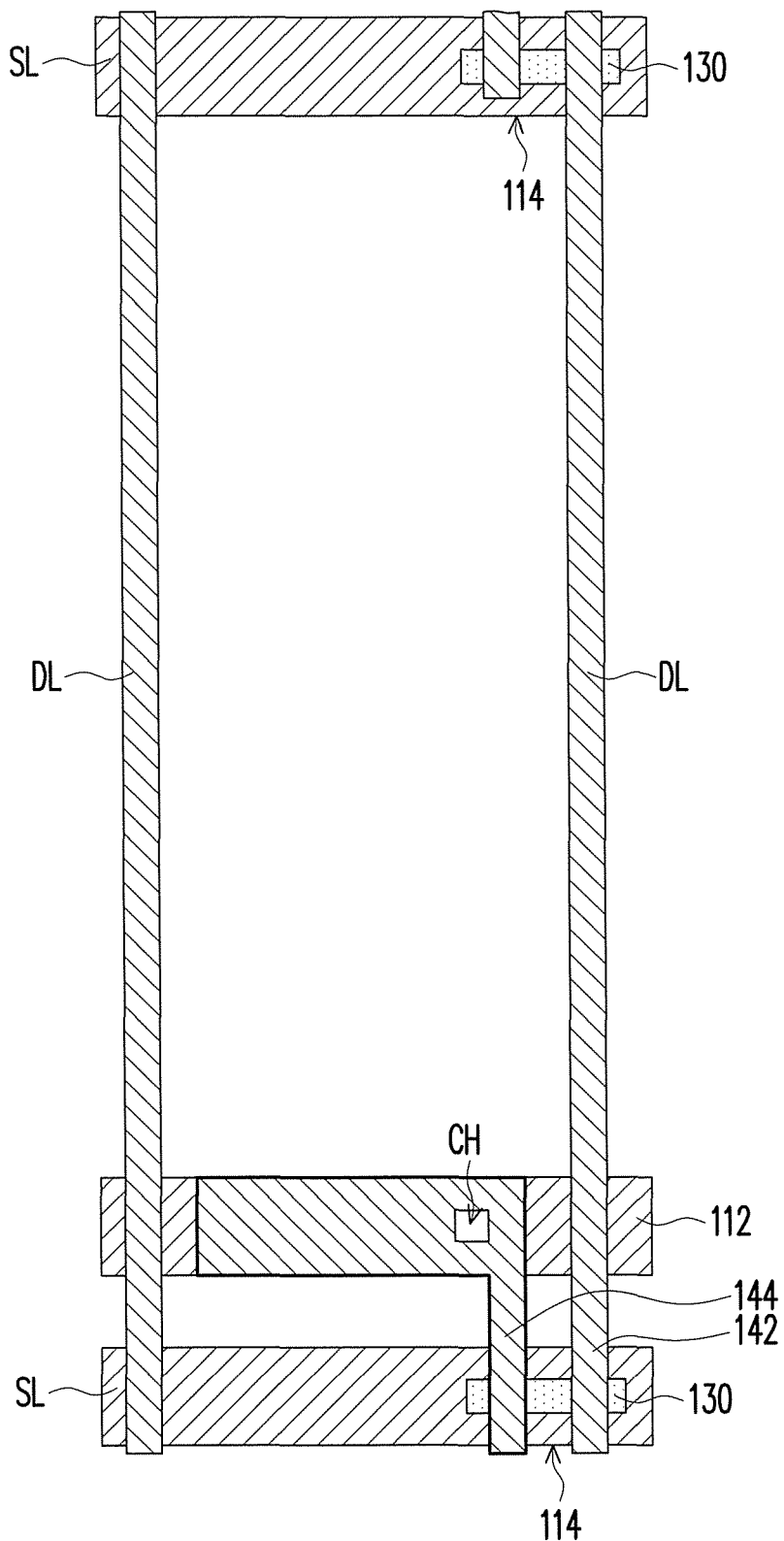

With reference to FIG. 4 and FIG. 6C, a second insulation layer 150 is formed to cover the second patterned metal layer 140, and the second insulation layer 150 has a contact opening CH that exposes the drain 144. In an embodiment of the invention, the second insulation layer 150 may be formed by performing a CVD process to cover the substrate SUB with an insulation layer (not shown), and the insulation layer may be made of silicon oxide, silicon nitride, or any other appropriate material. A portion of the insulation layer (i.e, the second insulation layer 150) is then removed by photo-etching, so as to form the contact opening CH that exposes the drain 144.

Figure 5:
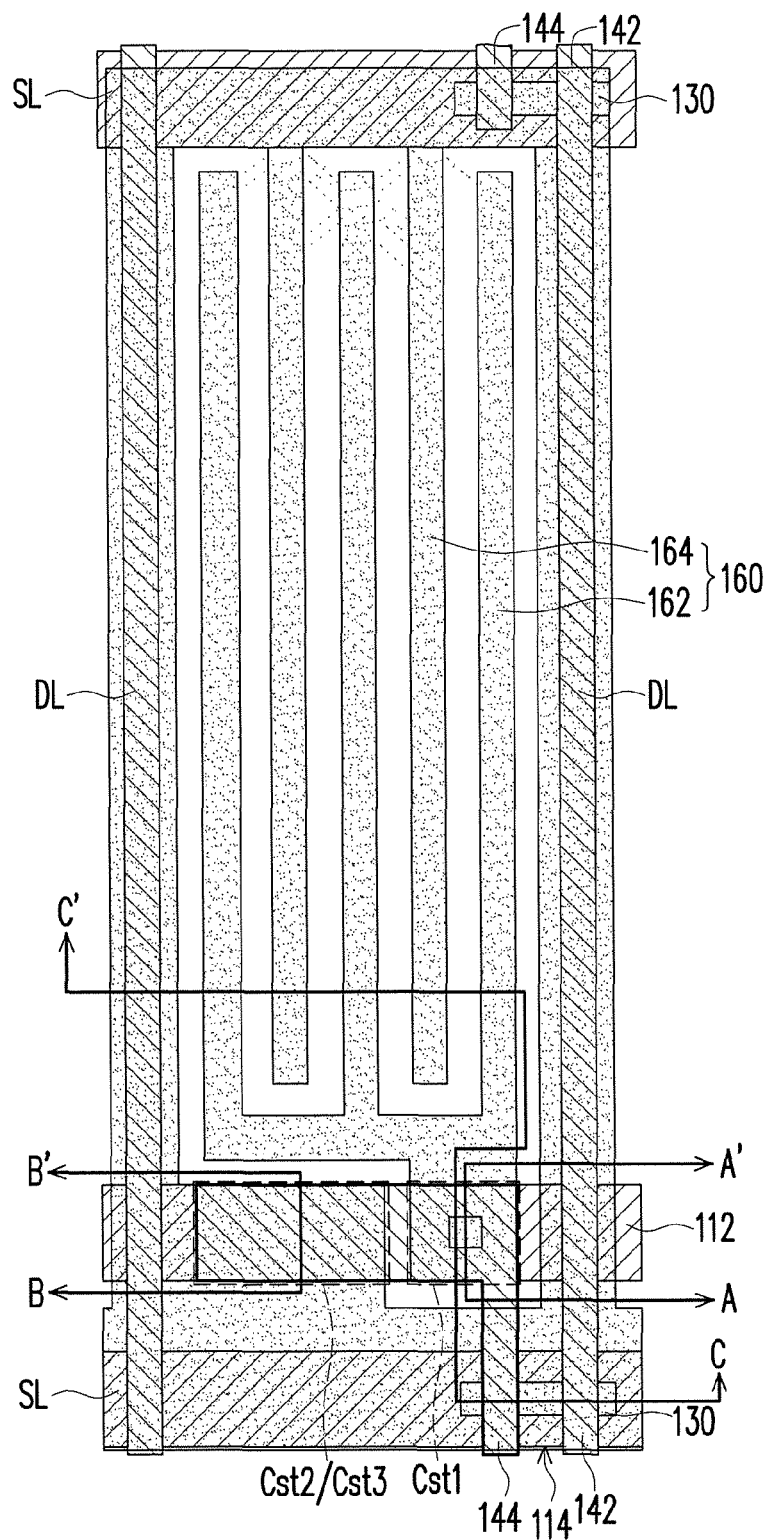
Figure 6A:
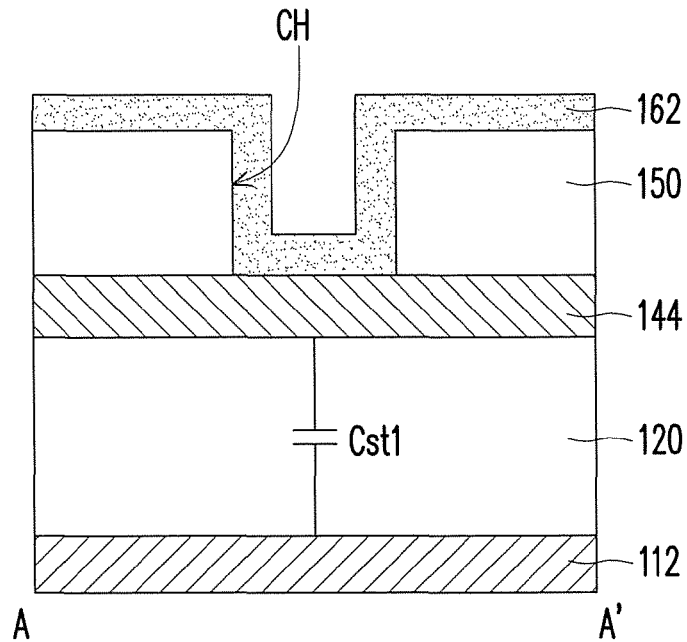
FIG. 6A is a schematic cross-sectional view taken along a sectional line A-A' depicted in FIG. 5.
Figure 6B:
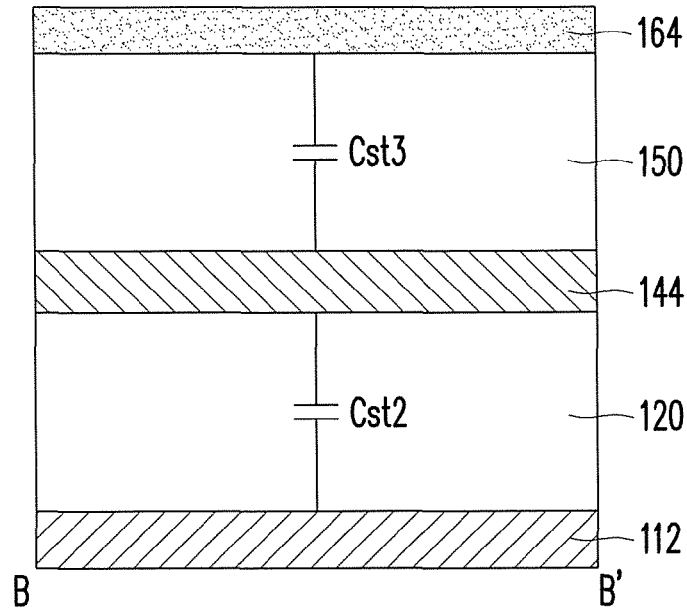
FIG. 6B is a schematic cross-sectional view taken along a sectional line B-B' depicted in FIG. 5.
Figure 6C:
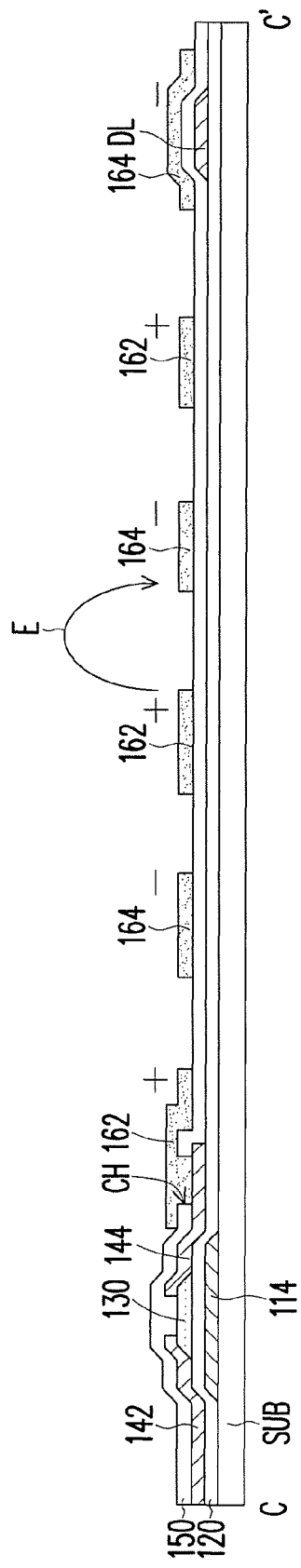
FIG. 6C is a cross-sectional schematic view taken along a sectional line C-C' depicted in FIG. 5.

With reference to FIG. 5 and FIG. 6C, an electrode layer 160 is formed on the second insulation layer 150, and the electrode layer 160 has a pixel electrode 162 and a common electrode 164. The pixel electrode 162 is connected to the drain 144 through the contact opening CH. So far, the fabrication of the pixel structure 100 is hereby completed. In an embodiment of the invention, the electrode layer 160 is made by performing a sputtering process to form a conductive layer (not shown) on the second insulation layer 150, for instance. A portion of the conductive layer is then removed by photo-etching, so as to form the pixel electrode 162 and the common electrode 164. The pixel electrode 162 and the common electrode 164 may be formed by using one photomask or two respective photomasks. Besides, the electrode layer 160 may be made of a transparent conductive material or a non-transparent conductive material, and the transparent conductive material may be selected from an indium tin oxide (ITO), an indium zinc oxide (IZO), and a combination thereof. In particular, the selected materials and the number of photomasks (one or two) may be combined in the manner described below. For instance, the pixel electrode 162 and the common electrode 164 may both be the transparent conductive layers and made by using the same photomask (i.e., a light-transmissive display), or the pixel electrode 162 and the common electrode 164 may both be the non-transparent conductive layers and made by using the same photomask (i.e., a light-reflective display). Alternatively, the pixel electrode 162 may be a transparent conductive layer made by using one photomask, and the common electrode 164 may be a non-transparent conductive layer made by using another photomask, or one photomask may be applied to form a transparent conductive layer at the locations of the pixel electrode 162 and the common electrode 164, and another photomask is further applied to additionally form a non-transparent conductive layer (e.g., a metal layer) at the location of the common electrode 164. Namely, the common electrode 164 may be a transparent electrode layer, and the common electrode 164, the drain 144, and the second insulation layer 150 together constitute the third storage capacitor Cst3. The common electrode 164 may also be a non-transparent electrode layer, and the common electrode 164, the drain 144, and the second insulation layer 150 may together constitute the third storage capacitor Cst3. The aforesaid combination of the selected materials and the number of photomasks (one or two) is merely exemplary and should not be construed as a limitation to the invention.

Note that the pixel electrode 162 and the common electrode 164 are electrically separated from each other and alternately arranged. The pixel electrode 162 and the common electrode 164 are located on the same plane (at one side of the active device matrix substrate). For instance, as shown in FIG. 6C, a positive voltage is applied to the pixel electrode 162, and a negative voltage is applied to the common electrode 164, so as to generate a lateral electric field E that may drive liquid crystal molecules (not shown) to rotate. Thereby, the wide-viewing-angle effect may be achieved, and the liquid crystal molecules may be in fast response to the lateral electric field E (the response time of the liquid crystal molecules is short). From another perspective, as shown in FIG. 5, the common electrode 164 substantially surrounds the peripheries of the pixel structure 100 and encloses the pixel electrode 162.

It should be mentioned that a portion of the common electrode 164 is extended above the common line 112 and overlapped with the second insulation layer 150 above the common line 112. According to the above-mentioned design, said components may be stacked to form a relatively large storage capacitor within the limited area, and the aperture ratio is not reduced.

To be more specific, as indicated in FIG. 5 and FIG. 6A, in the pixel structure 100, the common line 112, the first insulation layer 120, and the pixel electrode 162 together constitute the first storage capacitor Cst1. In FIG. 5 and FIG. 6B, the common line 112, the drain 144, and the common electrode 164 in the pixel structure 100 together constitute a sandwich structure. The common line 112, the first insulation layer 120, and the drain 144 together constitute a second storage capacitor Cst2. The drain 144, the second insulation layer 150, and the common electrode 164 together constitute a third storage capacitor Cst3.

As shown by the left portion of FIG. 5, due to the sandwich structure that is constituted by the common line 112, the drain 144, and the common electrode 164, the pixel structure 100 may have a relative large storage capacitor (the second and third storage capacitors Cst2 and Cst3) at the overlapping regions where the second and third storage capacitors Cst2 and Cst3 are both formed. The sufficiently large storage capacitor may better resolve the flickering issue and ensure favorable display quality.

Besides, it can be learned from FIG. 1 to FIG. 5 that the pixel structure 100 may be formed by performing the conventional five photo-mask process without additionally increasing the manufacturing costs.

The steps shown in FIG. 1 to FIG. 5 may be performed in a different order based on actual operational conditions. For instance, in an embodiment that is not shown in the drawings, the data line DL, the source 142, and the drain 144 may be formed in the step of forming the first patterned metal layer 110 as shown in FIG. 1; in the step of forming the semiconductor pattern 130 as shown in FIG. 2, the source 142 and the drain 144 are electrically connected to the semiconductor pattern 130, e.g., the source 142 and the drain 144 may be located at two respective sides of the semiconductor pattern 130 (i.e., the position relations among the source 142, the drain 144, and the semiconductor pattern 130 may be determined in consideration of the type of the active switch device); in the step of forming the second patterned metal layer 140 as shown in FIG. 3, the scan line SL, the common line 112, and the gate 114 may be formed, such that the gate 114, the source 142, and the drain 144 may together constitute a top gate active switch device (not shown); the steps shown in FIG. 4 and FIG. 5 are then applied to form the contact opening CH and the electrode layer 160. Here, as long as the sufficiently large storage capacitor (the storage capacitors Cst1, Cst2, and Cst3) may be formed within the limited area, the modifications and variations made by people skilled in the pertinent art do not depart from the spirit and scope of the invention.

Pixel Structure

The pixel structure 100 described in the embodiment of the invention may be understood with reference to FIG. 5 and FIG. 6A to FIG. 6C. The pixel structure 100 is formed on a substrate SUB, and the pixel structure 100 is driven by a scan line SL and a data line DL.

The pixel structure 100 includes a first patterned metal layer 110 disposed on the substrate SUB and having a common line 112 and a gate 114; a first insulation layer 120 covering the first patterned metal layer 110; a semiconductor pattern 130 located on the first insulation layer 120 above the gate 114; a second patterned metal layer 140 disposed on the first insulation layer 120 and having a source 142 and a drain 144 both electrically connected to the semiconductor pattern 130; a second insulation layer 150 covering the second patterned metal layer 140 and having a contact opening CH exposing the drain 144; and an electrode layer 160 disposed on the second insulation layer 150 and having a pixel electrode 162 and a common electrode 164. The pixel electrode 162 is connected to the drain 144 through the contact opening CH.

As indicated in FIG. 5 and FIG. 6A, it should be mentioned that the common line 112, the first insulation layer 120, and the pixel electrode 162 together constitute the first storage capacitor Cst1. In FIG. 5 and FIG. 6B, the common line 112, the drain 144, and the common electrode 164 together constitute a sandwich structure. The common line 112, the first insulation layer 120, and the drain 144 together constitute a second storage capacitor Cst2. The drain 144, the second insulation layer 150, and the common electrode 164 together constitute a third storage capacitor Cst3.

The amount of the storage capacitor within the limited area may be increased because (1) a portion of the drain 144 is extended above the common lien 112 and overlapped with the first insulation layer 120 above the common line 112, and (2) a portion of the common electrode 164 is extended above the common line 112 and overlapped with the second insulation layer 150 above the common line 112. According to the above-mentioned design, said components may be stacked to form a relatively large storage capacitor within the limited area, and the aperture ratio is not reduced. As a result, the display panel having the pixel structure 100 may simultaneously provide the sufficiently large storage capacitor and ensure the favorable aperture ratio, and thereby the flickering issue and the issue of unfavorable light source utilization rate may both be resolved.

Here, the pixel structure 100 may be an in-plane switch (IPS) pixel structure. Detailed descriptions and embodiments of the pixel structure 100 are already provided above and therefore will not be further explained hereinafter.

Active Device Matrix Substrate

Figure 7:
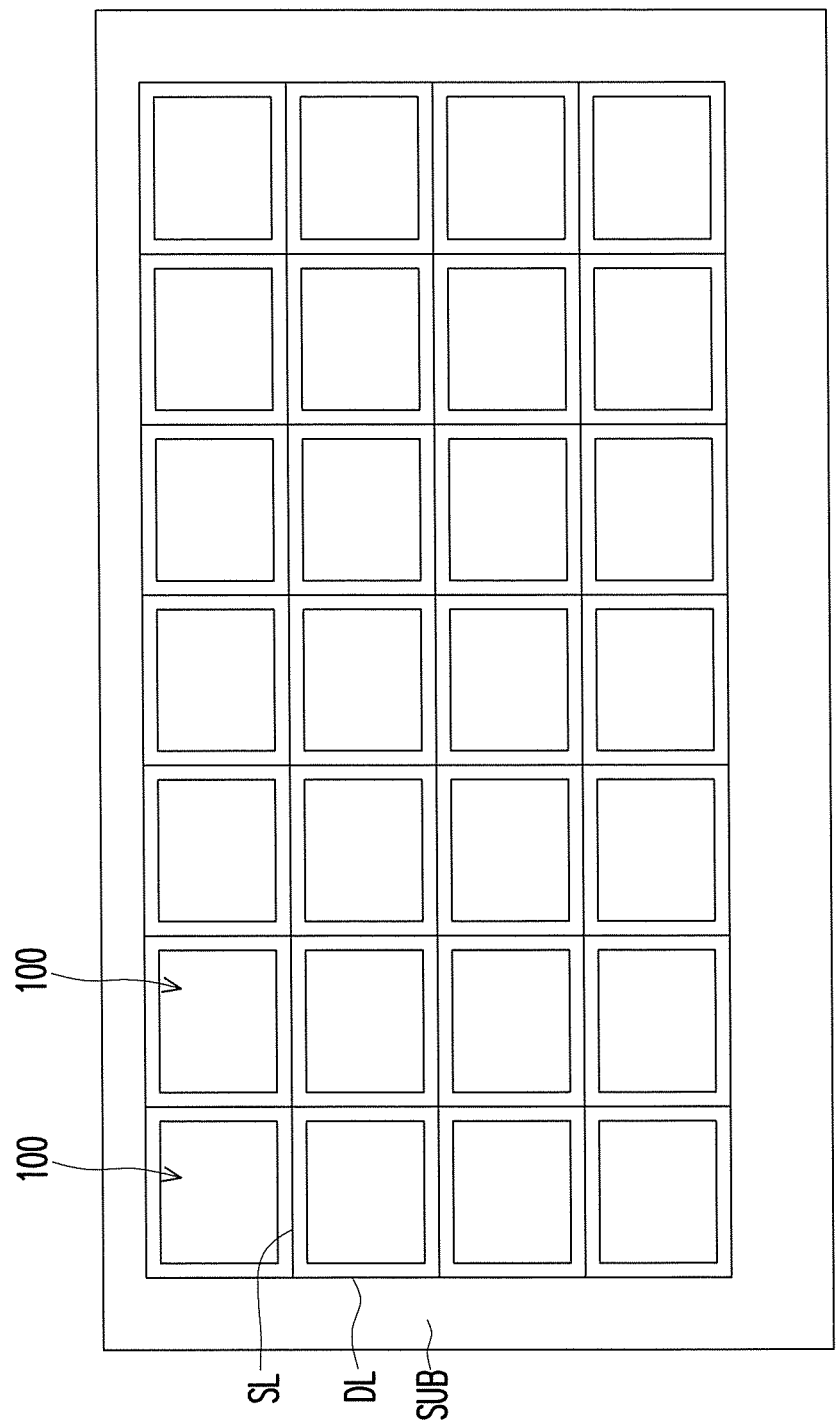
FIG. 7 is a schematic top view illustrating an active device matrix substrate according to an embodiment of the invention.

FIG. 7 is a schematic top view illustrating an active device matrix substrate according to an embodiment of the invention. With reference to FIG. 7, the active device matrix substrate 200 includes a substrate SUB and a plurality of aforesaid pixel structures 100 arranged in a matrix manner on the substrate SUB. Each of the pixel structures 100 is driven by a scan line SL and a data line DL. Images may be displayed by controlling the pixel structures 100 arranged in a matrix manner. Particularly, the pixel structures 100 capable of simultaneously ensuring the favorable aperture ratio and providing the sufficiently large storage capacitors (Cst1, Cst2, and Cst3) are applied in the active device matrix substrate 200, so as to reduce the flickers. Besides, the resultant aperture ratio is not reduced, and thus the light source utilization rate may be correspondingly improved. Detailed descriptions and embodiments of the pixel structure 100 are already provided above and therefore will not be further explained hereinafter.

Other Embodiments

A fringe field switching (FFS) pixel structure, a method of manufacturing the FFS pixel structure, and an active device matrix substrate having the pixel structures are introduced hereinafter. The following is merely exemplary and should not be construed as a limitation to the invention.

Figure 8:
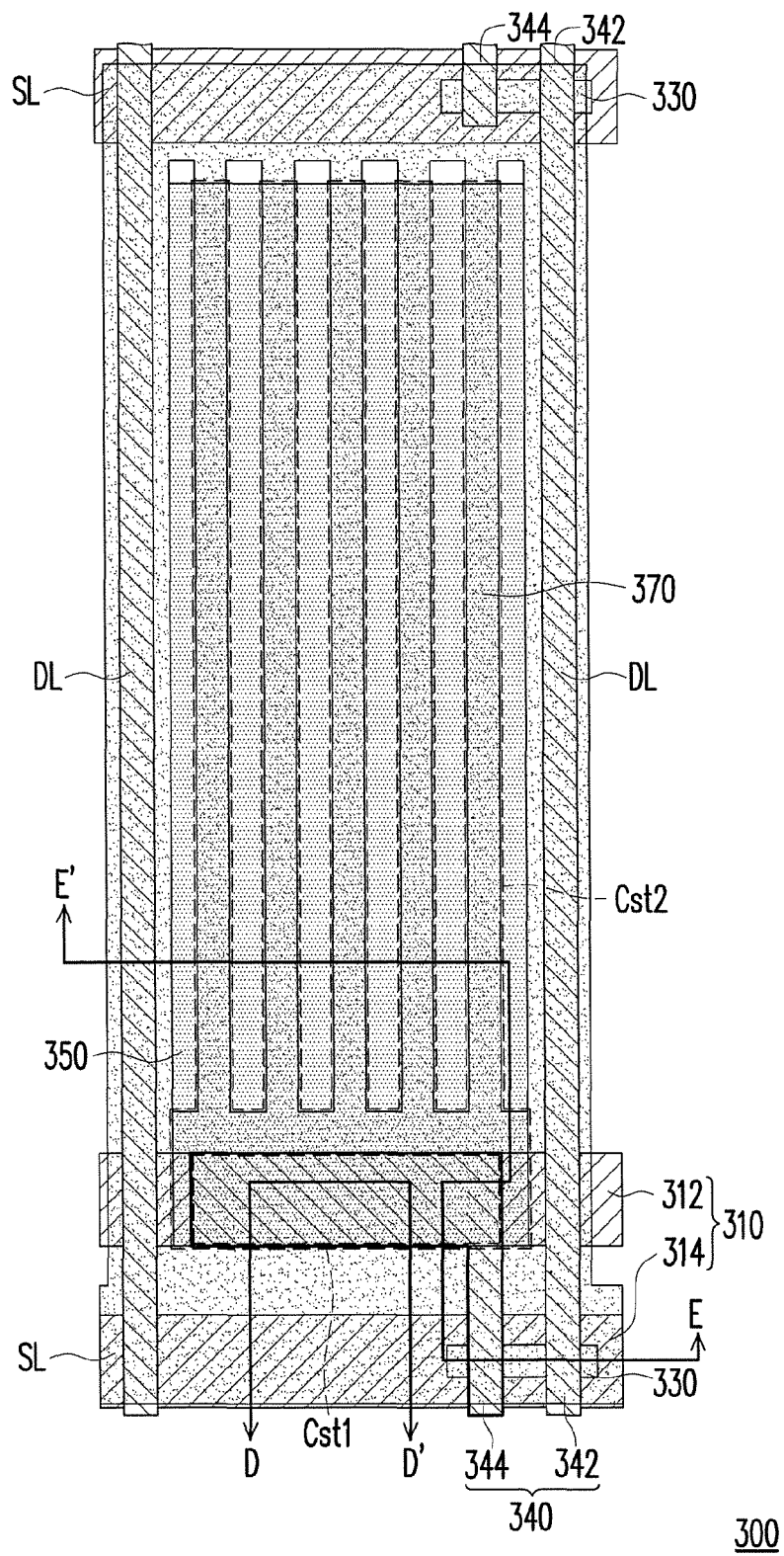
FIG. 8 is a schematic top view illustrating a process of manufacturing a pixel structure according to another embodiment of the invention.
Figure 9A:
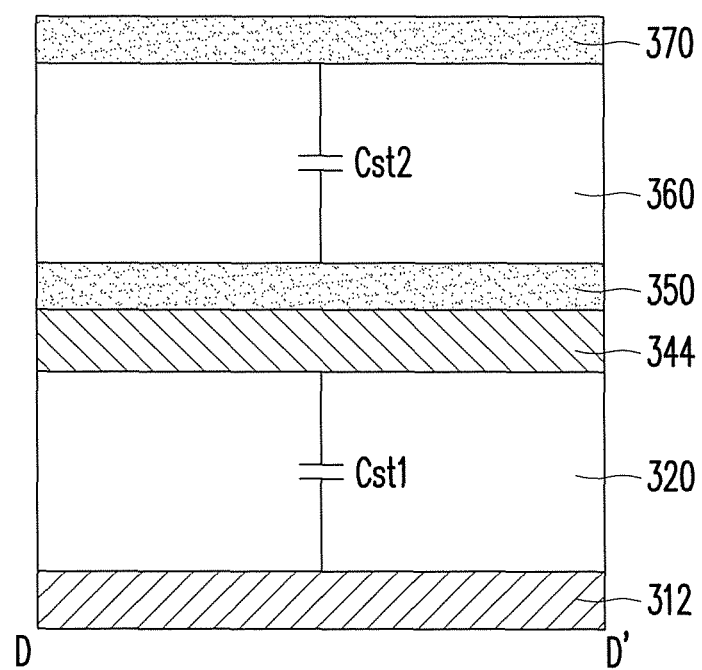
FIG. 9A is a schematic cross-sectional view taken along a sectional line D-D' depicted in FIG. 8.
Figure 9B:
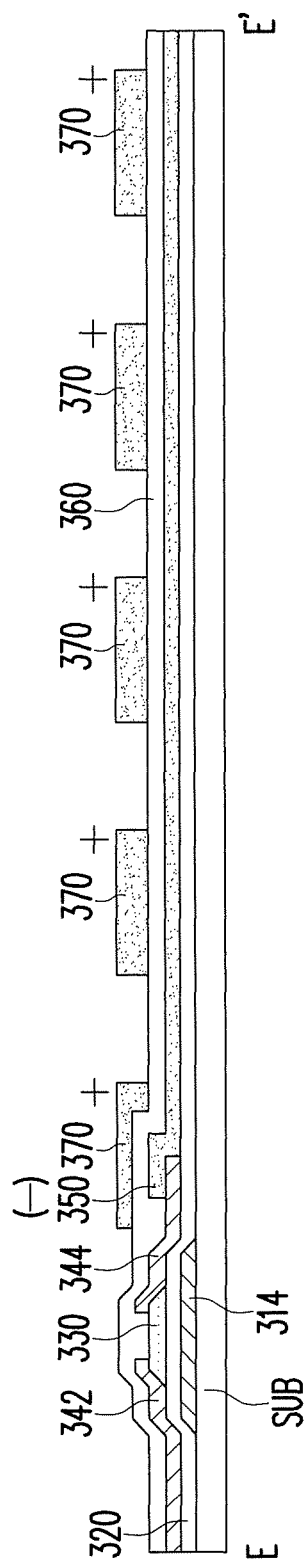
FIG. 9B is a schematic cross-sectional view taken along a sectional line E-E' depicted in FIG. 8.

FIG. 8 is a schematic top view illustrating a process of manufacturing a pixel structure according to another embodiment of the invention. FIG. 9A is a schematic cross-sectional view taken along a sectional line D-D' depicted in FIG. 8. FIG. 9B is a schematic cross-sectional view taken along a sectional line E-E' depicted in FIG. 8.

The relations of the stacked film layers in the pixel structure 300 are explained with reference to FIG. 8, FIG. 9A, and FIG. 9B. The pixel structure 300 is disposed on a substrate SUB, and the pixel structure 300 is driven by a scan line SL and a data line DL.

The pixel structure 300 includes a first patterned metal layer 310 disposed on the substrate SUB and having a common line 312 and a gate 314; a first insulation layer 320 covering the first patterned metal layer 310; a semiconductor pattern 330 located on the first insulation layer 320 above the gate 314; a second patterned metal layer 340 disposed on the first insulation layer 320 and having a source 342 and a drain 344 both electrically connected to the semiconductor pattern 330; a first electrode layer 350 disposed above the second patterned metal layer 340 and electrically connected to the drain 344; a second insulation layer 360 covering the first electrode layer 350; and a second electrode layer 370 disposed on the second insulation layer 360.

As illustrated in FIG. 8 and FIG. 9A, the common line 312, the first insulation layer 320, and the first electrode layer 350 together constitute a first storage capacitor Cst1, and the first electrode layer 350, the second insulation layer 360, and the second electrode layer 370 together constitute a second storage capacitor Cst2. Besides, a portion of the drain 344 is extended above the common line 312 and overlapped with the first insulation layer 320 above the common line 312.

It should be mentioned that the storage capacitors Cst1 and Cst2 may be stacked within the limited area without reducing the aperture ratio because a portion of the drain 344 is extended above the common line 312 and overlapped with the first insulation layer 320 above the common line 312. Additionally, the first electrode layer 350 is electrically connected to the drain 344, and therefore the voltage levels of the two film layers are the same.

As illustrated in FIG. 8, according to the relations of the stacked film layers in the pixel structure 300, the underlying first electrode layer 350 is substantially located within the pixel region of the entire pixel structure 300. Besides, the overlying second electrode layer 370 may be a comb-shaped electrode, and a great portion of the second electrode layer 370 is overlapped with the first electrode layer 350. Note that a portion of the second electrode layer 370 is extended above the common line 312 and overlapped with the second insulation layer 370 above the common line 312. Thereby, within the limited area, the increase in the overlapped area of the second electrode layer 370, the first electrode layer 350, and the second insulation layer 360 leads to the second storage capacitor Cst2 with the increasing amount.

In the present embodiment, the pixel structure 300 is the FFS pixel structure, and a process of manufacturing the pixel structure 300 is substantially similar to the process of manufacturing the pixel structure 100. The difference therebetween lies in that the negative electrode (the first electrode layer 350) in the pixel structure 300 is exemplarily formed on the substrate SUB, a plurality of insulation layers (at least the second insulation layer 360) are formed to cover the negative electrode on the substrate SUB, and then the positive electrode (the second electrode layer 370) is formed. Hence, in the pixel structure 300, the contact opening CH formed in the IPS pixel structure 100 described in the previous embodiment is not required. The detailed process of manufacturing the pixel structure 300 is omitted hereinafter.

Particularly, the first electrode layer 350 may act as the pixel electrode and may be controlled by the active device (the drain 344, the source 342, and the gate 314) through the drain 344; the second electrode layer 370 may serve as the common electrode externally connected to a stable common voltage. Additionally, as indicated in FIG. 8, the second electrode layer 370 may be a comb-shaped electrode; therefore, a fringe electric field may be generated between the second electrode layer 370 and the first electrode layer 350 to manipulate the liquid crystal molecules.

Here, the first and second electrode layers 350 and 370 may be transparent electrode layers, i.e., the material of the first and second electrode layers 350 and 370 may be selected from ITO, IZO, and a combination thereof, so as to form a light-transmissive display. It is also likely to form the first and second electrode layers 350 and 370 with use of an appropriate metal conductive material, so as to form a light-reflective display. The descriptions provided above are merely exemplary and should not be construed as limitations to the invention. Besides, as shown in FIG. 7, the pixel structure 300 may also be formed in the active device matrix substrate, which will not be further described hereinafter.

To sum up, the pixel structure, the method of manufacturing the pixel structure, and the active device matrix substrate having the pixel structure described in the embodiments of the invention at least have following advantages.

In the IPS pixel structure or the FFS pixel structure, the common line, the first insulation layer, and the pixel electrode pixel (the first electrode layer) may together constitute the first storage capacitor. Besides, within the limited area, at least a portion of the drain may be extended above the common line and overlapped with the first insulation layer above the common line, and thereby the overlapping area of the common line, the drain (the first electrode layer), and the common electrode (the second electrode layer) constitutes a sandwich structure, which may further increase the amount of the storage capacitor. Hence, the area of the pixel structure is not additionally occupied, and the pixel structure can still have the favorable aperture ratio. Moreover, the amount of the storage capacitor is sufficient. As a result, the pixel structure described herein may simultaneously have a favorable aperture ratio and a sufficiently large storage capacitor, and thereby images with satisfactory quality may be displayed. Furthermore, the pixel structure described herein may be formed by performing the five photo-mask process without additionally increasing the manufacturing costs. Last but not least, the active device matrix substrate having the aforesaid pixel structure may display images with favorable quality.

The foregoing description of the embodiments of the invention has been presented for purposes of illustration and description. Although the invention has been disclosed by the above embodiments, they are not intended to limit the invention. Any person having ordinary knowledge in the art may make some modifications and alterations without departing from the spirit and scope of the invention. In view of the foregoing, it is intended that the invention cover modifications and variations of this invention provided they fall within the scope of the following claims and their equivalents.

What is claimed is:

1. A pixel structure disposed on a substrate and driven by a scan line and a data line, the pixel structure comprising:
   a first patterned metal layer, disposed on the substrate, the first patterned metal layer having a common line and a gate;
   a first insulation layer, covering the first patterned metal layer;
   a semiconductor pattern, located on the first insulation layer above the gate;
   a second patterned metal layer, disposed on the first insulation layer, the second patterned metal layer having a source and a drain, the source and the drain being electrically connected to the semiconductor pattern;
   a second insulation layer, covering the second patterned metal layer, the second insulation layer having a contact opening exposing the drain; and
   an electrode layer, disposed on the second insulation layer, the electrode layer having a pixel electrode and a common electrode, the pixel electrode being connected to the drain through the contact opening,
   wherein the common line, the first insulation layer, and the pixel electrode together constitute a first storage capacitor,
   the common line, the drain, and the common electrode together constitute a sandwich structure,
   the common line, the first insulation layer, and the drain together constitute a second storage capacitor,
   the drain, the second insulation layer, and the common electrode together constitute a third storage capacitor, and
   a portion of the drain is extended above the common line and overlapped with the first insulation layer above the common line.

2. The pixel structure as recited in claim 1, wherein, a portion of the common electrode is extended above the common line and overlapped with the second insulation layer above the common line.

3. The pixel structure as recited in claim 1, wherein, the pixel electrode and the common electrode are alternately arranged.

4. The pixel structure as recited in claim 1, wherein, a portion of the scan line is the gate.

5. The pixel structure as recited in claim 1, wherein, a portion of the data line is the source.

6. The pixel structure as recited in claim 1, wherein, the gate, the source, and the drain together constitute an active switch device.

7. The pixel structure as recited in claim 1, wherein, a material of the electrode layer is selected from indium tin oxide, indium zinc oxide, and a combination thereof.

8. A method of manufacturing a pixel structure on a substrate, the pixel structure being driven by a scan line and a data line, the method comprising:
   forming a first patterned metal layer on the substrate, the first patterned metal layer having a common line and a gate;
   forming a first insulation layer, the first insulation layer covering the first patterned metal layer;
   forming a semiconductor pattern on the first insulation layer above the gate;
   forming a second patterned metal layer on the first insulation layer, the second patterned metal layer having a source and a drain, the source and the drain being electrically connected to the semiconductor pattern;
   forming a second insulation layer, the second insulation layer covering the second patterned metal layer and having a contact opening exposing the drain; and
   forming an electrode layer on the second insulation layer, the electrode layer having a pixel electrode and a common electrode, the pixel electrode being connected to the drain through the contact opening,
   wherein the common line, the first insulation layer, and the pixel electrode together constitute a first storage capacitor,
   the common line, the drain, and the common electrode together constitute a sandwich structure,
   the common line, the first insulation layer, and the drain together constitute a second storage capacitor,
   the drain, the second insulation layer, and the common electrode together constitute a third storage capacitor, and
   a portion of the drain is extended above the common line and overlapped with the first insulation layer above the common line.

9. The method of manufacturing the pixel structure as recited in claim 8, wherein,
   a portion of the common electrode is extended above the common line and overlapped with the second insulation layer above the common line.

10. The method of manufacturing the pixel structure as recited in claim 8, wherein,
    the pixel electrode and the common electrode are alternately arranged.

11. The method of manufacturing the pixel structure as recited in claim 8, wherein,
    a portion of the scan line is the gate.

12. The method of manufacturing the pixel structure as recited in claim 8, wherein,
    a portion of the data line is the source.

13. The method of manufacturing the pixel structure as recited in claim 8, wherein,
    the gate, the source, and the drain together constitute an active switch device.

14. The method of manufacturing the pixel structure as recited in claim 8, wherein,
    a material of the electrode layer is selected from indium tin oxide, indium zinc oxide, and a combination thereof.

15. An active device matrix substrate, comprising:
    a substrate; and
    a plurality of pixel structures, disposed on the substrate, each of the pixel structures comprising:
      a first patterned metal layer, disposed on the substrate, the first patterned metal layer having a common line and a gate;
      a first insulation layer, covering the first patterned metal layer;
      a semiconductor pattern, located on the first insulation layer above the gate;
      a second patterned metal layer, disposed on the first insulation layer, the second patterned metal layer having a source and a drain, the source and the drain being electrically connected to the semiconductor pattern;

a second insulation layer, covering the second patterned metal layer, the second insulation layer having a contact opening exposing the drain; and an electrode layer, disposed on the second insulation layer, the electrode layer having a pixel electrode and a common electrode, the pixel electrode being connected to the drain through the contact opening, wherein the common line, the first insulation layer, and the pixel electrode together constitute a first storage capacitor, the common line, the drain, and the common electrode together constitute a sandwich structure, the common line, the first insulation layer, and the drain together constitute a second storage capacitor, the drain, the second insulation layer, and the common electrode together constitute a third storage capacitor, and a portion of the drain is extended above the common line and overlapped with the first insulation layer above the common line.

16. The active device matrix substrate as recited in claim 15, wherein, a portion of the common electrode is extended above the common line and overlapped with the second insulation layer above the common line.

17. The active device matrix substrate as recited in claim 15, wherein, the pixel electrode and the common electrode are alternately arranged.

18. A pixel structure disposed on a substrate and driven by a scan line and a data line, the pixel structure comprising:

a first patterned metal layer, disposed on the substrate, the first patterned metal layer having a common line and a gate;

a first insulation layer, covering the first patterned metal layer;

a semiconductor pattern, located on the first insulation layer above the gate;

a second patterned metal layer, disposed on the first insulation layer, the second patterned metal layer having a source and a drain, the source and the drain being electrically connected to the semiconductor pattern;

a first electrode layer, disposed above the second patterned metal layer and electrically connected to the drain;

a second insulation layer, covering the first electrode layer; and a second electrode layer, disposed on the second insulation layer, wherein the common line, the first insulation layer, and the first electrode layer together constitute a first storage capacitor, the first electrode layer, the second insulation layer, and the second electrode layer together constitute a second storage capacitor, and a portion of the drain is extended above the common line and overlapped with the first insulation layer above the common line.

19. The pixel structure as recited in claim 18, wherein, a portion of the second electrode layer is extended above the common line and overlapped with the second insulation layer above the common line.

20. The pixel structure as recited in claim 18, wherein, a material of the first electrode layer and a material of the second electrode layer are selected from indium tin oxide, indium zinc oxide, and a combination thereof.

* * * * *